(12) United States Patent
Yang et al.

(10) Patent No.: US 11,685,994 B2
(45) Date of Patent: Jun. 27, 2023

(54) CVD DEVICE PUMPING LINER

(71) Applicant: Taiwan Semiconductor Manufacturing Co., Ltd., Hsinchu (TW)

(72) Inventors: Sheng-chun Yang, Tainan (TW); Yi-Ming Lin, Tainan (TW); Chih-tsung Lee, Hsinchu (TW); Yun-Tzu Chiu, Hsinchu (TW); Chao-Hung Wan, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 94 days.

(21) Appl. No.: 16/570,274

(22) Filed: Sep. 13, 2019

(65) Prior Publication Data
US 2021/0079524 A1    Mar. 18, 2021

(51) Int. Cl.
| | | |
|---|---|---|
| *C23C 16/44* | (2006.01) | |
| *C23C 16/458* | (2006.01) | |
| *C23C 16/50* | (2006.01) | |
| *C23C 16/455* | (2006.01) | |

(52) U.S. Cl.
CPC ...... *C23C 16/4412* (2013.01); *C23C 16/4583* (2013.01); *C23C 16/45565* (2013.01); *C23C 16/50* (2013.01)

(58) Field of Classification Search
CPC .................................................. C23C 16/4412
See application file for complete search history.

(56) References Cited

U.S. PATENT DOCUMENTS

| | | | | |
|---|---|---|---|---|
| 5,322,567 A | * | 6/1994 | Deaton | C23C 16/4412 118/725 |
| 5,441,568 A | * | 8/1995 | Cho | C23C 16/4412 118/728 |
| 5,895,530 A | * | 4/1999 | Shrotriya | C23C 16/4412 118/715 |
| 6,261,408 B1 | * | 7/2001 | Schneider | H01L 21/67017 118/715 |
| 6,402,847 B1 | * | 6/2002 | Takagi | C23C 16/4405 118/715 |
| 10,113,231 B2 | | 10/2018 | Dubois et al. | |
| 2002/0045362 A1 | * | 4/2002 | Yang | C23C 16/4412 438/791 |
| 2002/0127508 A1 | * | 9/2002 | Jin | C23C 16/4401 432/93 |

(Continued)

FOREIGN PATENT DOCUMENTS

| | | | | |
|---|---|---|---|---|
| CN | 1930322 A | | 3/2007 | |
| EP | 463633 | * | 1/1992 | ......... C23C 16/4412 |

(Continued)

*Primary Examiner* — Keath T Chen
(74) *Attorney, Agent, or Firm* — Seed IP Law Group LLP

(57) ABSTRACT

Pumping liners for use in an apparatus for depositing a material on a work piece by chemical vapor deposition includes a plurality of unevenly spaced apertures are disclosed. Uneven spacing of the plurality of apertures produces a uniform flow of processing gases within a processing chamber with which the pumping liner is associated. Films of materials deposited onto a work piece by chemical vapor deposition techniques using disclosed pumping liners exhibit desirable properties such as uniform thickness and smooth and uniform surfaces.

20 Claims, 17 Drawing Sheets

412

(56) References Cited

U.S. PATENT DOCUMENTS

| | | | | |
|---|---|---|---|---|
| 2002/0134308 A1* | 9/2002 | Amano | ............ | H01L 21/67017 |
| | | | | 118/715 |
| 2003/0094135 A1* | 5/2003 | Komiya | ............ | H01J 37/32449 |
| | | | | 118/715 |
| 2005/0223986 A1* | 10/2005 | Choi | ............ | B05B 1/005 |
| | | | | 118/715 |
| 2006/0151114 A1* | 7/2006 | Fink | ............ | H01J 37/3244 |
| | | | | 118/715 |
| 2008/0152838 A1 | 6/2008 | Sen et al. | | |
| 2011/0303148 A1* | 12/2011 | Xie | ............ | C23C 16/4409 |
| | | | | 118/719 |
| 2013/0284288 A1* | 10/2013 | Kim | ............ | H01J 37/32834 |
| | | | | 137/526 |
| 2014/0023796 A1* | 1/2014 | Ejiri | ............ | H01J 37/3405 |
| | | | | 204/192.15 |
| 2014/0170316 A1* | 6/2014 | Shibuya | ............ | C01B 32/05 |
| | | | | 427/249.1 |
| 2014/0261176 A1* | 9/2014 | Liu | ............ | C23C 16/45591 |
| | | | | 118/715 |
| 2015/0252475 A1 | 9/2015 | Lin et al. | | |
| 2018/0214812 A1* | 8/2018 | Knight | ............ | F04C 19/001 |

FOREIGN PATENT DOCUMENTS

| | | |
|---|---|---|
| JP | 2008525999 A | 7/2008 |
| TW | 473855 B | 1/2002 |
| TW | 201542860 A | 11/2015 |
| WO | 02/41377 A1 | 5/2002 |

\* cited by examiner

412

CVD DEVICE PUMPING LINER

BACKGROUND

Integrated circuits (IC) are manufactured by forming discrete semiconductor devices on a surface of a semiconductor substrate. An example of such a substrate is a silicon (Si) or silicon dioxide ($SiO_2$) wafer. Semiconductor devices are oftentimes manufactured on very large scales where thousands of micro-electronic devices (e.g., transistors, capacitors, and the like) are formed on a single substrate. To interconnect the devices on a substrate, a multi-level network of interconnect structures is formed. Material is deposited on the substrate in layers and selectively removed in a series of controlled steps. In this way, various conductive layers are interconnected to one another to facilitate propagation of electronic signals.

One manner of depositing films in the semiconductor industry is known as chemical vapor deposition, or "CVD." CVD may be used to deposit films of various kinds, including intrinsic and doped amorphous silicon, silicon oxide, silicon nitride, silicon oxynitride and the like. Semiconductor CVD processing is generally done in a vacuum chamber by heating precursor gases which dissociate and react to form the desired film. In order to deposit films at low temperatures and relatively high deposition rates, a plasma can be formed from the precursor gases in the chamber during deposition. Such processes are known as plasma enhanced chemical vapor deposition, or "PECVD."

Accurate reproducibility of substrate processing is an important factor for improving productivity when fabricating integrated circuits. Precise control of various process parameters is required for achieving consistent results across a substrate, as well as the results that are reproducible from substrate to substrate. More particularly, uniformity of deposited material layers is one of requirements for achieving good manufacturing yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
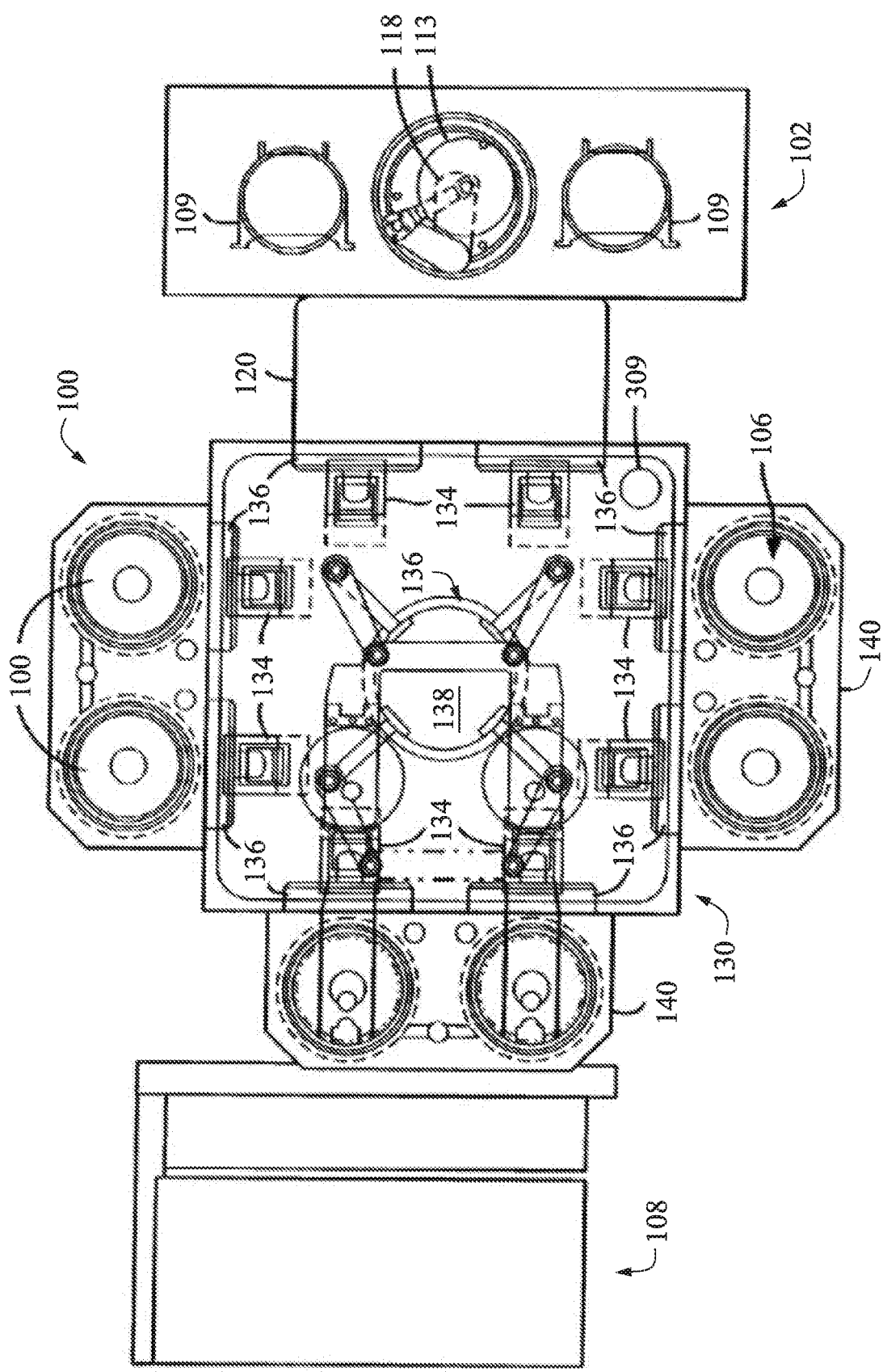
FIG. 1 is a top view of an example of a semiconductor processing system that includes a pair of processing chambers.

The disclosed embodiments include a pumping liner for use in an apparatus for depositing a material onto a work piece using chemical vapor deposition techniques. Pumping liners in accordance with disclosed embodiments include a plurality of apertures passing through a body of the pumping liner. In some embodiments, adjacent apertures of the plurality of apertures are unevenly spaced apart. In some embodiments, the diameter of the apertures of a pumping liner are unequal, the shape of the apertures passing through a pumping liner differ or the apertures passing through the pumping liner are tilted relative to an upper and lower surface of the pumping liner. Utilization of pumping liners in accordance with disclosed embodiments improves uniformity of flow of process gases through a processing chamber with which the pumping liner is associated. Improved process gas flow uniformity results in more uniform process gas velocity and pressure within the processing chamber, which improves the uniformity of the material, e.g., its thickness, deposited on the work piece.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 provides a plan view of an example of a semiconductor processing system 100. The semiconductor processing system 100 includes processing chambers 106 in which embodiments of the present disclosure are implemented. The illustrative processing chambers 106 are in pairs to further increase processing throughput.

The semiconductor system 100 generally includes multiple distinct regions. The first region is a front end staging area 102. The front end staging area 102 supports wafer cassettes 109 pending processing. The wafer cassettes 109, in turn, support substrates or wafers 113. A front end wafer handler 118, such as a robot, is mounted on a staging platform adjacent to wafer cassette turntables. Semiconductor processing system 100 includes a load lock chamber 120. Wafers 113 are loaded into and unloaded from the load lock chamber 120. Preferably, the front end wafer handler 118 includes a wafer mapping system to index the substrates 113 in each wafer cassette 109 in preparation for loading the substrates 113 into a load lock cassette disposed in the load lock chamber 120. System 100 includes a transfer chamber 130. The transfer chamber 130 houses a wafer handler 132 that handles substrates 113 received from the load lock chamber 120. The wafer handler 132 includes a robot assembly 138 mounted to the bottom of the transfer chamber 130. The wafer handler 132 delivers wafers through sealable passages 136. Slit valve actuators 134 actuate sealing mechanisms for the passages 136. The passages 136 mate with wafer passages in process chambers 140 to allow entry of substrates 113 into the processing regions for positioning on a wafer heater pedestal (shown at 228 in FIG. 2).

Figure 2:
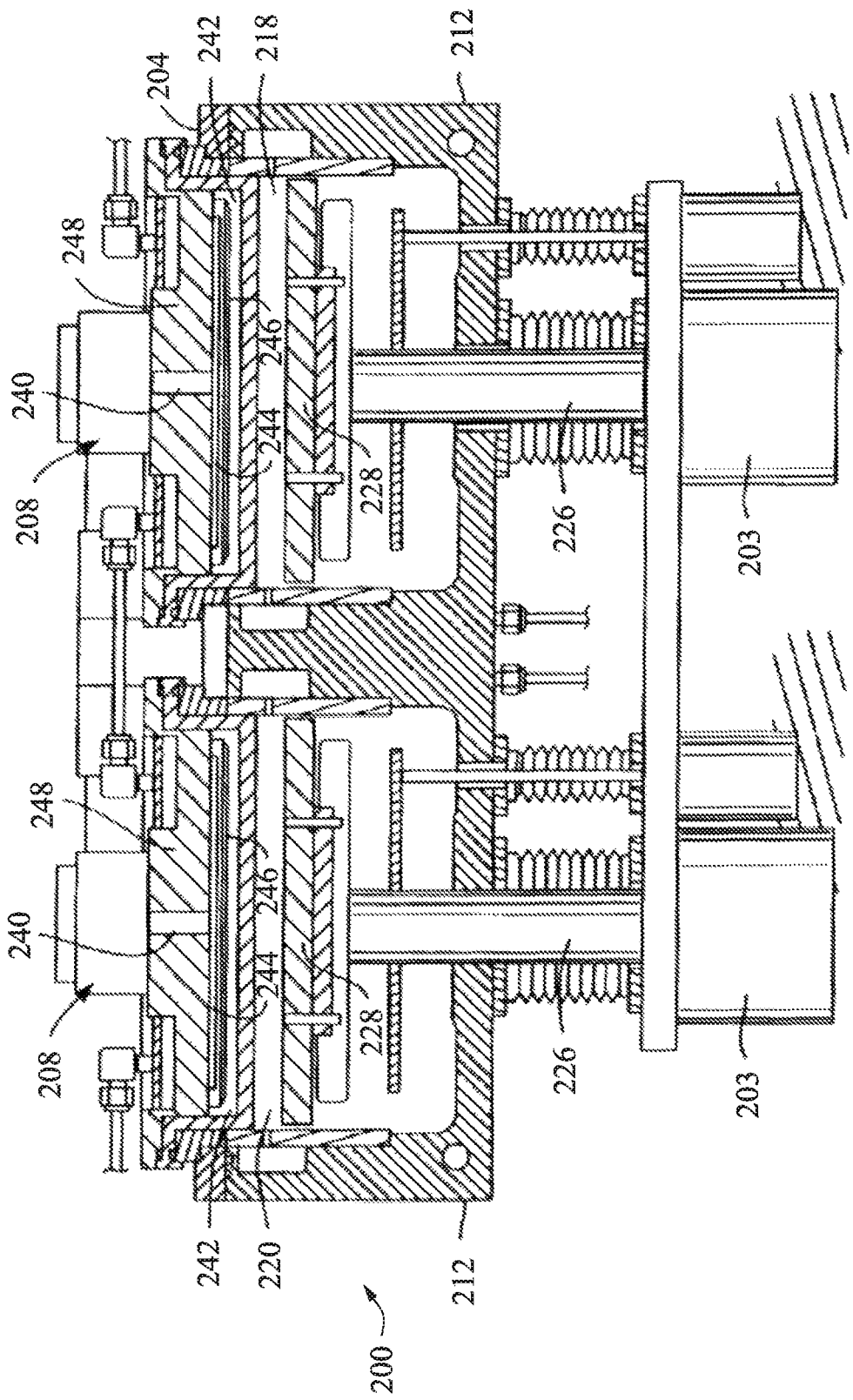
FIG. 2 is a cross-sectional view of the pair of processing chambers of FIG. 1.

FIG. 2 presents a cross-sectional, schematic diagram of a deposition chamber 200. The deposition chamber 200 is a CVD chamber for depositing a carbon-based gaseous substance, such as a carbon-doped silicon oxide sublayer. This figure is based upon features of the Producer chamber currently manufactured by Applied Materials, Inc. The Producer CVD chamber (200 mm or 300 mm) has two isolated processing regions that may be used to deposit carbon-doped silicon oxides and other materials.

The deposition chamber 200 has a body 212 that defines an inner chamber area. Separate processing regions 218 and 220 are provided. Each processing region 218, 220 has a pedestal 228 for supporting a substrate (not seen) within the deposition chamber 200. The pedestal 228 typically includes a heating element (not shown). Preferably, the pedestal 228 is movably disposed in each processing region 218, 220 by a stem 226 which extends through the bottom of the chamber body 212 where it is connected to a drive system 203. Internally movable lift pins (not shown) are provided in the pedestal 228 to engage a lower surface of the substrate. A support ring (not shown) is also provided above the pedestal 228. The support ring may be part of a multi-component substrate support assembly that includes a cover ring and a capture ring. The lift pins act on the ring to receive a substrate before processing, or to lift the substrate after deposition for transfer to the next station.

Each of the processing regions 218, 220 includes a gas distribution assembly 208 disposed through a chamber lid 204 to deliver gases into the processing regions 218, 220. The gas distribution assembly 208 of each processing region normally includes a gas inlet passage 240 which delivers gas into a shower head assembly 242. The showerhead assembly 242 is comprised of an annular base plate 248 having a blocker plate 244 disposed intermediate a face plate 246. The showerhead assembly 242 includes a plurality of nozzles (shown schematically at Pr in FIG. 3) through which gaseous mixtures are injected during processing. The nozzles direct gas, e.g., oxygen, silane, silane-containing hydrocarbons and/or argon, downward over a substrate, thereby depositing an amorphous film. An RF (radio frequency) feedthrough provides a bias potential to the showerhead assembly 242 to facilitate generation of a plasma between the face plate 246 of the showerhead assembly 242 and the pedestal 228. During a plasma-enhanced chemical vapor deposition process, the pedestal 228 may serve as a cathode for generating the RF bias within the chamber walls 202. The cathode is electrically coupled to an electrode power supply to generate a capacitive electric field in the deposition chamber 200. Typically an RF voltage is applied to the cathode while the chamber body 202 is electrically grounded. Power applied to the pedestal 228 creates a substrate bias in the form of a negative voltage on the upper surface of the substrate. This negative voltage is used to attract ions from the plasma formed in the chamber 200 to the upper surface of the substrate. The capacitive electric field forms a bias which accelerates inductively formed plasma species toward the substrate to provide a more vertically oriented anisotropic filming of the substrate during deposition, and etching of the substrate during cleaning.

Figure 3:
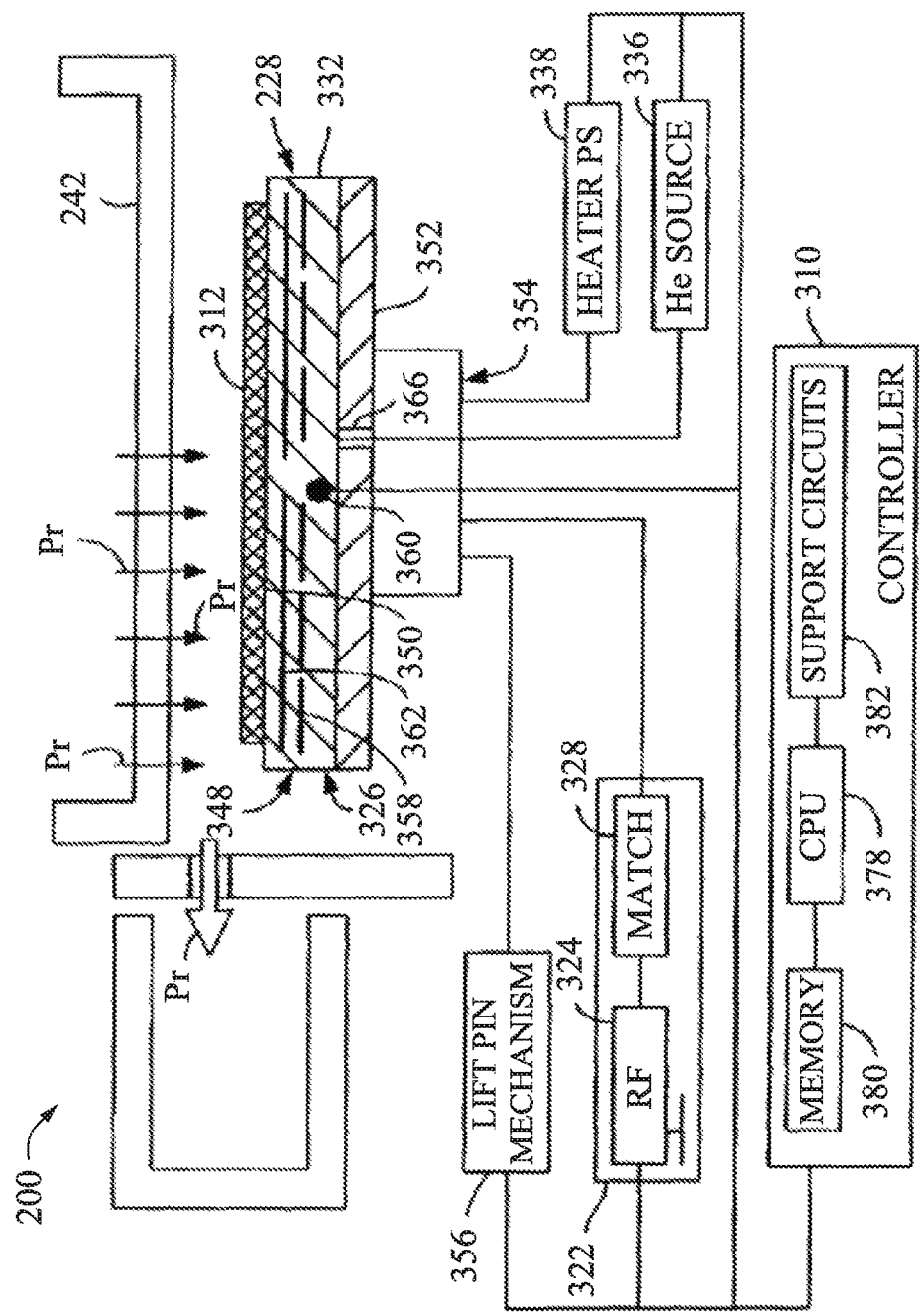
FIG. 3 is a partial schematic cross-sectional view of a processing chamber of FIGS. 1 and 2.

FIG. 3 depicts a simplified cross-sectional view of a substrate support of the deposition chamber 200 of FIGS. 1 and 2. The images in FIG. 3 are simplified for illustrative purposes and are not depicted to scale.

The pedestal 228 comprises a substrate heater assembly 348, a base plate 352, and a back plane assembly 354. The back plane assembly 354 is coupled to a source 322 of substrate bias power, a controlled heater power supply 338, and a source 336 of a backside gas (e.g., helium (He)), as well as to a lift pin mechanism 356. During substrate processing, the pedestal 228 supports a substrate 312 and controls the temperature and biasing of the substrate. The substrate 312 is generally a standardized semiconductor wafer, for example a 200 mm or 300 mm wafer.

The substrate heater assembly 348 comprises a body (heater member 332) and heater member 332 further comprises a plurality of embedded heating elements 358, a temperature sensor (e.g., thermocouple) 360, and a plurality of radio-frequency (RF) electrodes 362.

The embedded heating elements 358 are coupled to the heater power supply 338. The temperature sensor 360 monitors, in a conventional manner, the temperature of the heater member 332. The measured temperature is used in a feedback loop to regulate the output of the heater power supply 338.

The embedded RF electrodes 362 couple the source 322 to the substrate 312, as well as to a plasma of the process gas mixture in the reaction volume. The source 322 generally comprises a RF generator 324 and a matching network 328. The generator 324 generally is capable of producing up to 5000 W of continuous or pulsed power at a frequency is a range from about 50 kHz to 13.6 MHz. In other embodiments, the generator 324 may be a pulsed DC power generator.

The temperature of the substrate 312 is controlled by stabilizing a temperature of the heater member 332. In one embodiment, the helium gas from a gas source 336 is provided via a gas conduit 366 to grooves (or, alternatively, positive dimples) formed in the heater member 332 under the substrate 312. The helium gas provides a heat transfer between the heater member 332 and the substrate 312 and facilitates uniform heating of the substrate. Using such thermal control, the substrate 312 may be maintained at a temperature between about 200 and 800° C.

Figure 4:
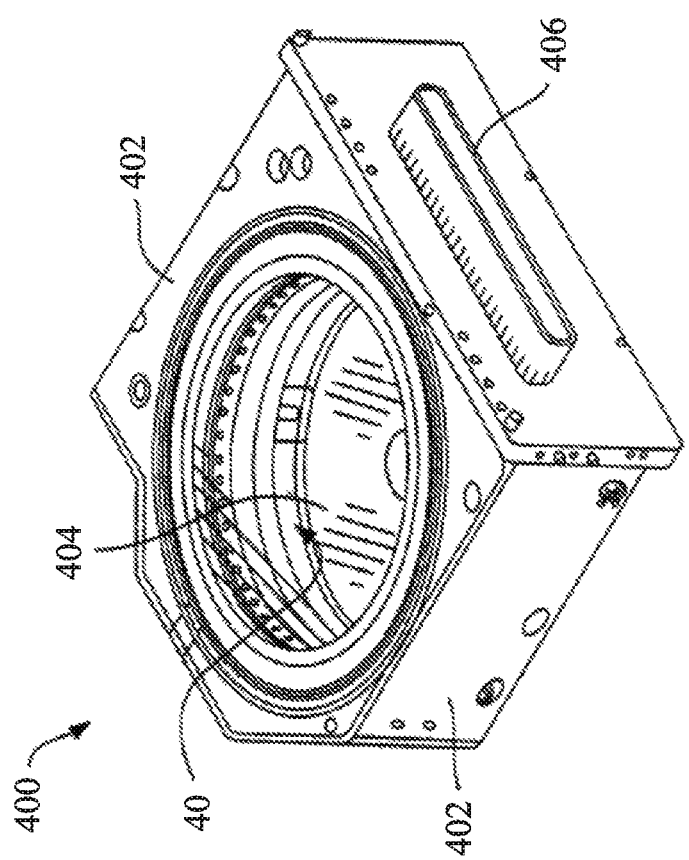
FIG. 4 is a perspective view of a portion of the processing chamber of FIGS. 1-3.

FIG. 4 presents a perspective view of a portion of a deposition chamber 400. The deposition chamber 400 includes a process kit 40 that includes a top liner in accordance with the present disclosure. A chamber body 402 is provided to define a substrate processing area 404, and for supporting various liners of the process kit 40. A wafer slit 406 is seen in the chamber body 402, defining a wafer pass through slit. In this manner, a substrate may be selectively moved into and out of the deposition chamber 400. A substrate is not shown within the hollow chamber. The wafer slit 406 is selectively opened and closed by a gate apparatus (not shown). The gate apparatus is supported by the chamber wall 402. The gate isolates the chamber environment during substrate processing.

The chamber body 402 is preferably fabricated from an aluminum oxide or other ceramic compound. Ceramic material is preferred due to its low thermal conductivity properties. The chamber body 402 may be cylindrical or other shape. The chamber body 402 of FIG. 4 has an outer polygonal profile, and a circular inner diameter.

Figure 7:
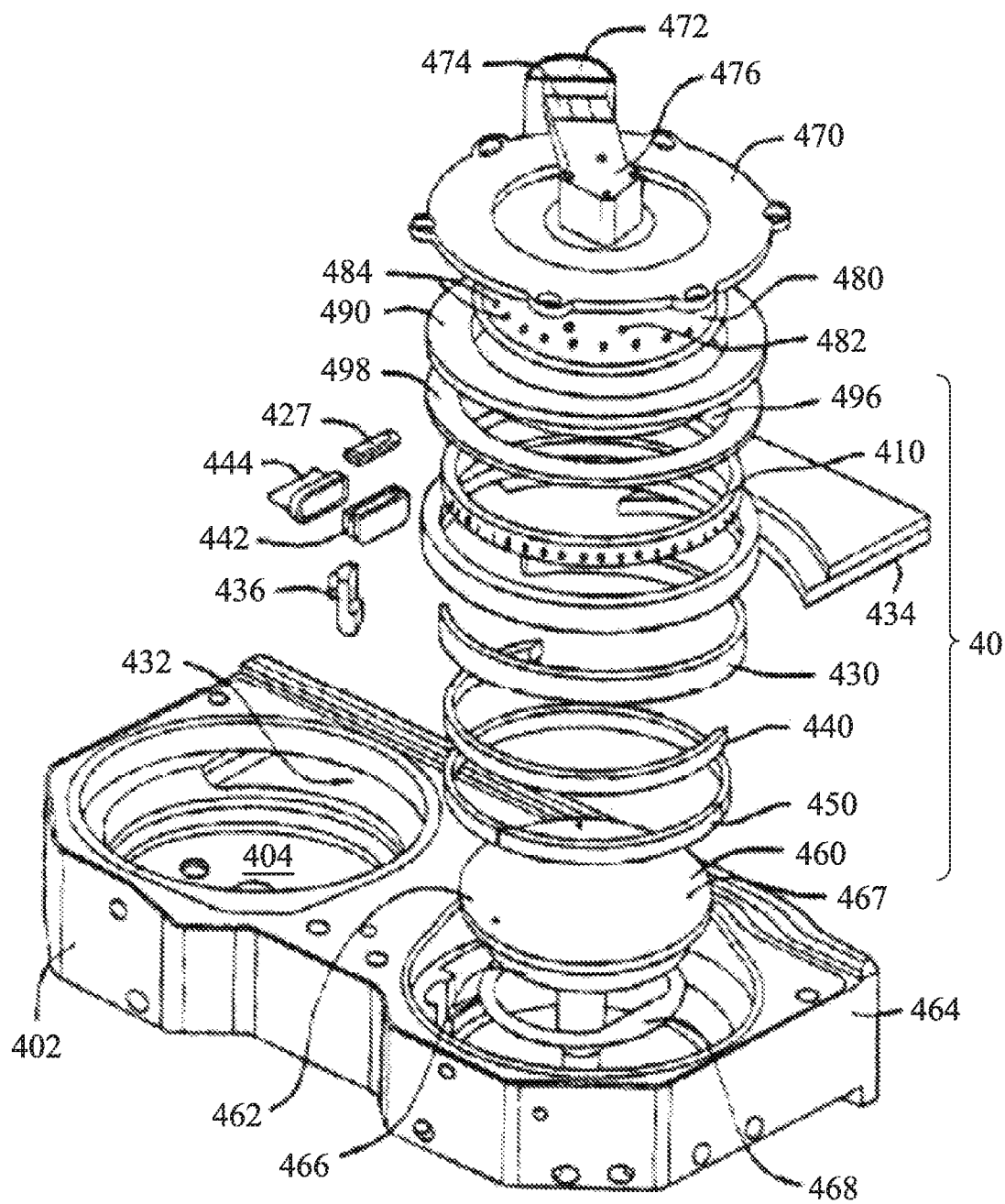
FIG. 7 is an exploded view of a processing chamber of FIGS. 1-3.

As noted, the chamber body 402 is configured to support a series of liners and other interchangeable processing parts. These processing parts are generally disposable, and come as part of a "process kit" 40 specific for a particular chamber application or configuration. A process kit may include a top pumping liner, a middle liner, a lower liner, a gas distribution plate, a gas diffuser plate, a heater, a shower head, or other parts. Certain liners may be formed integrally; however, it is preferred in some applications to provide separate liners that are stacked together to allow thermal expansion between the liners. FIG. 7 provides a perspective view of an embodiment of a process kit 40. The liners and other equipment of the process kit 40 are shown exploded above a deposition chamber 400. The deposition chamber 400 of FIG. 7 will be discussed in greater detail below.

Figure 5:
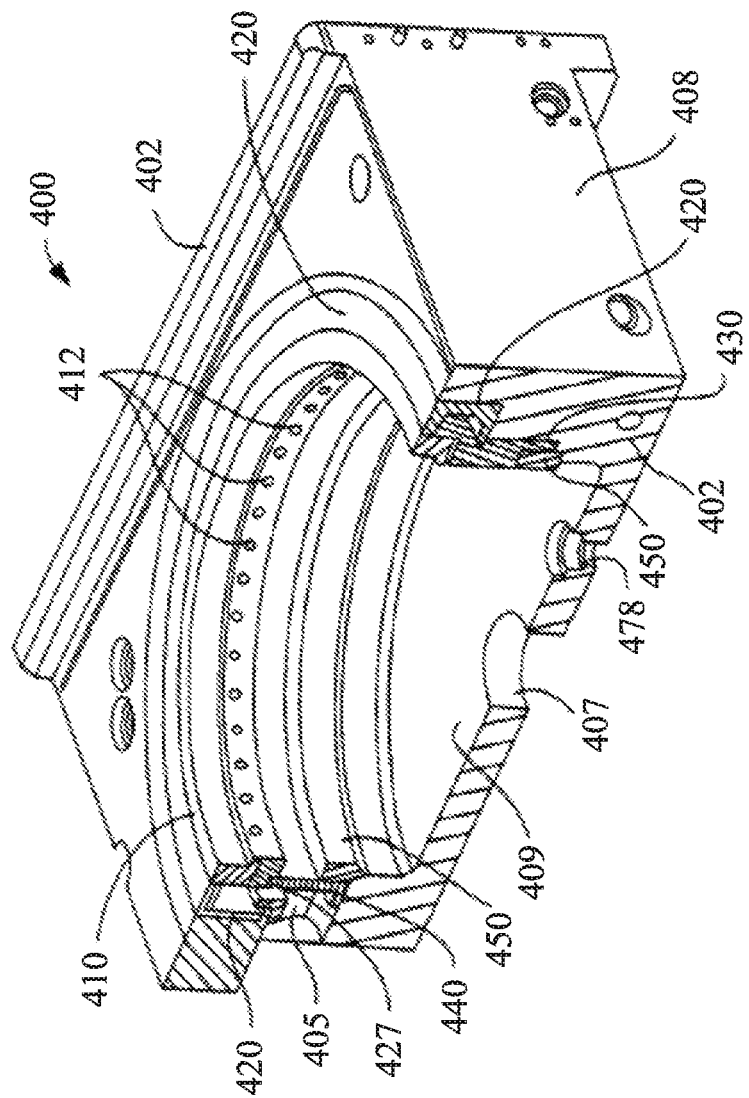
FIG. 5 is a cutaway perspective view of a portion of the processing chamber of FIGS. 1-3.

FIG. 5 shows a cutaway, perspective view of the illustrative deposition chamber 400 of FIG. 4. The geometry of the chamber body 402 is more clearly seen, including side 408 and bottom 409 portions of the body 402. An opening 405 is formed in the side portion 408 of the body 402. The opening 405 serves as a channel for receiving process gasses during a deposition, etching or cleaning process.

A substrate is not shown within the hollow chamber 404. However, it is understood that a substrate is supported within the hollow chamber 404 on a pedestal, such as pedestal 228 of FIG. 2. The pedestal is supported by a shaft that extends through opening 407 in the bottom portion 409 of the body 402. In addition, it is understood that a gas processing system (not shown in FIG. 5) is provided for the deposition chamber 400. An opening 478 is provided in the illustrative chamber 400 for receiving a gas conduit. The conduit delivers gas to gas box (seen at 472 in FIG. 7). From there, gas is delivered into the processing area 404.

Certain parts of a process kit 40 for a deposition chamber are visible in FIGS. 4 and 5. These include a top pumping liner 410, a supporting C-channel liner 420, a middle liner 440 and a bottom liner 450. As noted, these liners 410, 420, 440 and 450 are shown and will be described in greater detail in connection with FIG. 7, below. A seal member 427 is provided at an interface of the C-channel liner 420 with a pumping port liner 442, and at an interface of the pumping liner 410 with the pumping port liner 442, as will be also shown and described in greater detail in connection with FIG. 6A, below.

Figure 6B:
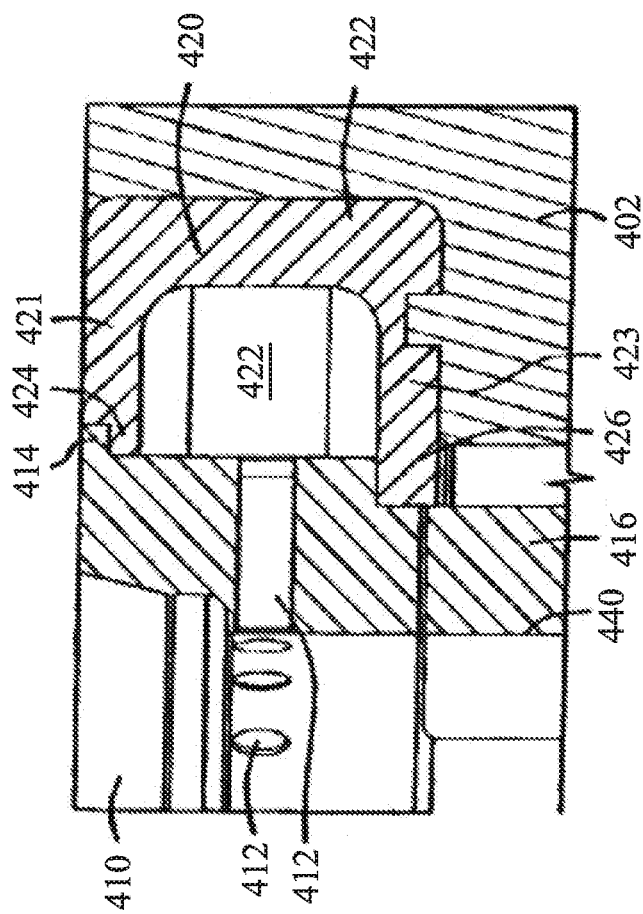
FIG. 6B is an enlarged view of the cross-sectional area 6B of the processing chamber of FIG. 6.
Figure 6:
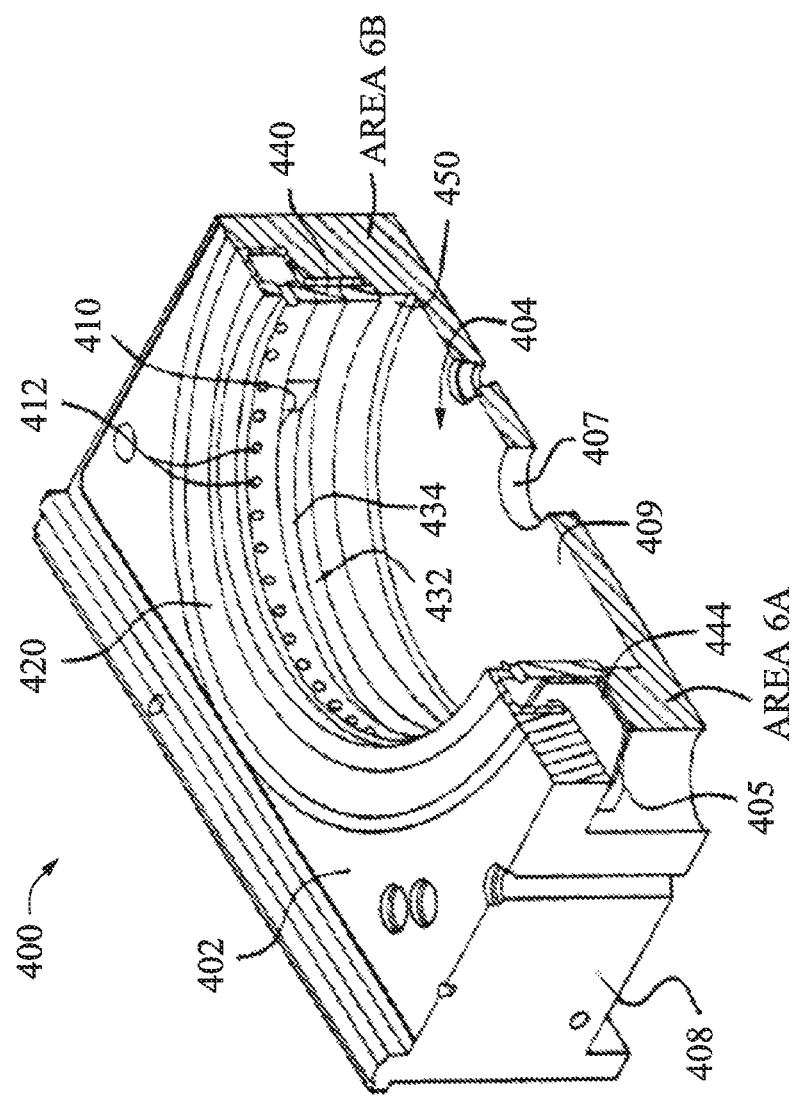
FIG. 6 is a cutaway perspective view of a portion of the processing chamber of FIGS. 1-3.

FIG. 6 shows another perspective view of the chamber body 402 of FIG. 5. Reference numbers from FIG. 5 are, in some instances repeated. FIG. 6 is provided to highlight the two exposed areas from the cutaway view. These two cross-sectional areas are area 6A and area 6B. Features of the chamber 400 shown in areas 6A and 6B are seen more clearly in the respective enlarged cross-sectional views of FIGS. 6A and 6B. These features will also be described in detail below.

FIG. 7 provides an exploded view of a chamber body portion 400. The first item of equipment seen in the view of FIG. 7 is a top cover 470. The top cover 470 is centrally located within the processing area 404, and protrudes through the chamber lid (not seen). The top cover 470 serves as a plate to support certain gas delivery equipment. This equipment includes a gas box 472 which receives gas through a gas supply conduit (not shown). (The conduit is inserted through opening 478 in the bottom 409 of the chamber body 402, as seen in FIG. 5). The gas box 472 feeds gas into a gas input 476. The gas input 476 defines an arm that extends over to the center of the top cover 470. In this way, processing and cleaning gases may be introduced centrally into the processing area 404 above the substrate.

An RF power is supplied to the gas box 472. This serves to generate plasma from the processing gases. A constant voltage gradient 474 is disposed between the gas box 472 and the gas input 476. The constant voltage gradient 474, or "CVG," controls the power level as the gas moves from the gas box 472 towards the grounded pedestal within the processing area 404.

Immediately below the top cover 470 is a blocker plate 480. The blocker plate 480 defines a plate concentrically placed below the top cover 470. The blocker plate 480 includes a plurality of bolt holes 482. The bolt holes 482 serve as a through-opening through which screws or other connectors may be placed for securing the blocker plate 480 to the top cover 470. A spacing is selected between the blocker plate 480 and the top cover 470. Gas is distributed in this spacing during processing, and then delivered through the blocker plate 480 by means of a plurality of perforations 484. In this way, processing gases may be evenly delivered into the processing area 404 of the chamber 400. The blocker plate 480 also provides a high pressure drop for gases as they are diffused.

Below the blocker plate 480 is a shower head 490. The shower head 490 is concentrically placed below the top cover 470. The shower head 490 includes a plurality of nozzles (not seen) for directing gases downward onto the substrate (not seen). A face plate 496 and isolator ring 498 are secured to the shower head 490. The isolator ring 498 electrically isolates the shower head 490 from the chamber body 402. The isolator ring 498 is preferably fabricated from a smooth and relatively heat resistant material, such as Teflon or ceramic.

Disposed below the shower head 490 is a top liner, or "pumping liner" 410. In the embodiment of FIG. 7, the pumping liner 410 defines a circumferential body having a plurality of pumping holes or apertures 412 disposed there around and through the circumferential body of the pumping liner. During a wafer processing process, a vacuum is pulled from a back side of the top liner 410, drawing gases through the pumping holes 412 and into a channel portion 425 (seen more clearly in FIGS. 6A and 6B). The pumping holes 412 provide the primary flow path for processing gases, as depicted in the schematic view of FIG. 3.

Figure 6A:
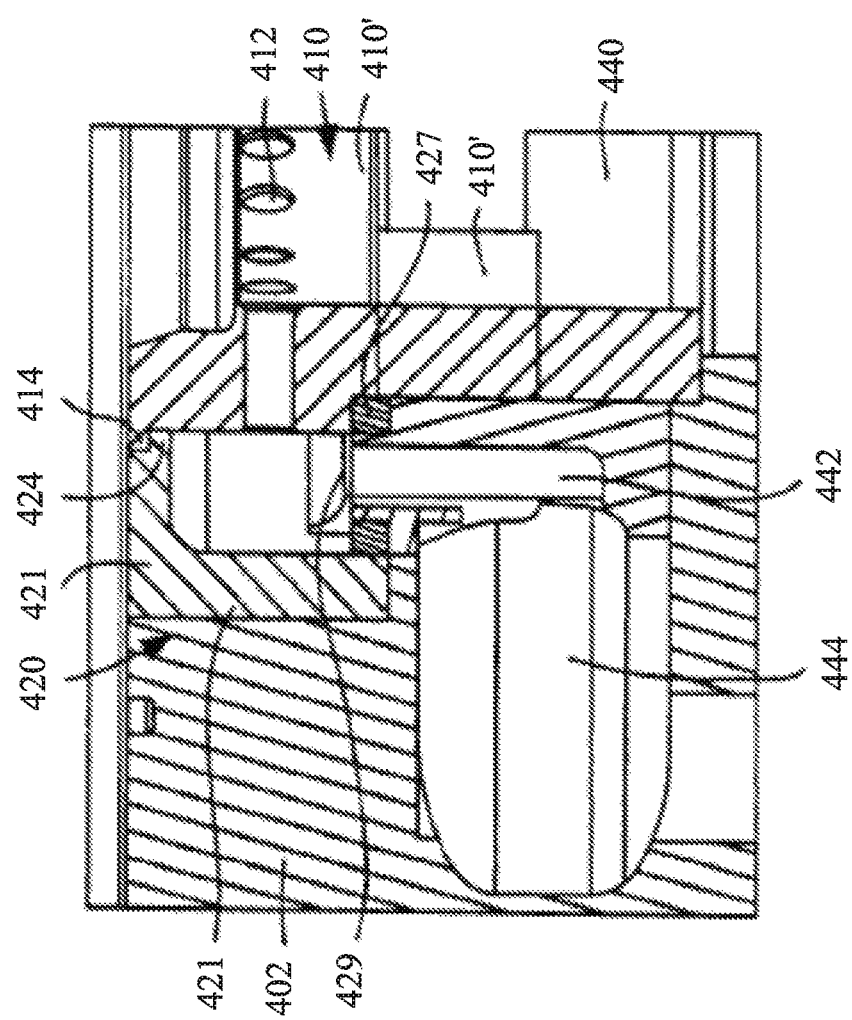
FIG. 6A is an enlarged view of the cross-sectional area 6A of the processing chamber of FIG. 6.
Figure 6B:
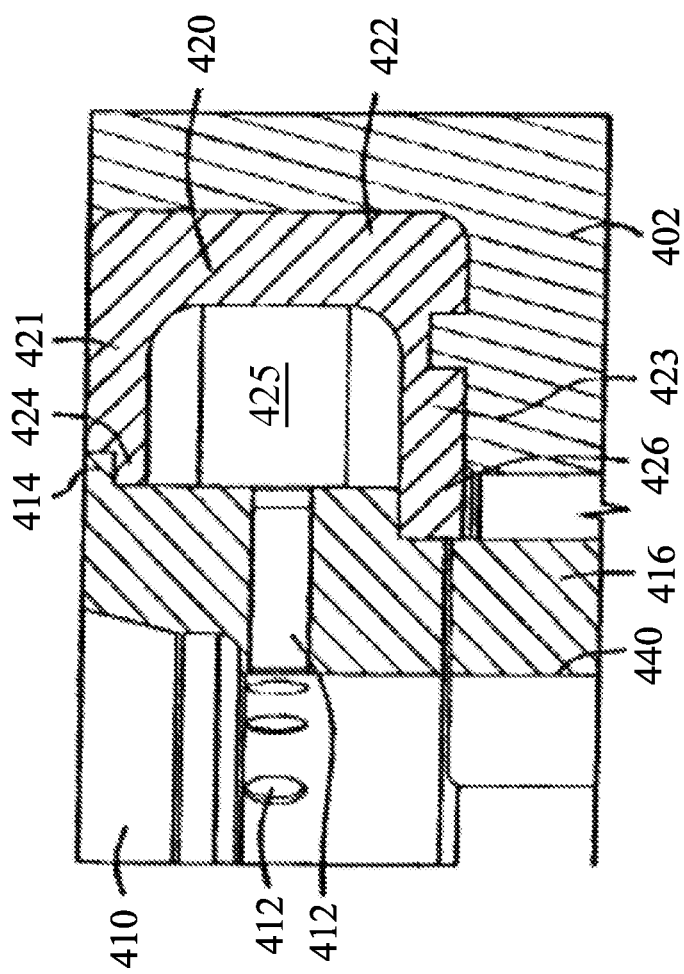

Turning to the enlarged cross sectional views of FIGS. 6A and 6B, features of the top liner 410 can be more readily seen. FIG. 6A provides an enlarged view of cross-sectional area 6A from FIG. 6. Similarly, FIG. 6B provides an enlarged view of area 6B from FIG. 6. The pumping liner 410 is visible in each of these enlarged figures.

The pumping liner 410 defines a circumferential body 410', and serves to hold a plurality of pumping holes or apertures 412. In the arrangement of FIG. 7, the pumping liner 410 includes an upper lip 414 on an upper surface area (810 in FIG. 8), and a lower shoulder 416 along a lower surface area (812 in FIG. 8). In some embodiments, the upper surface area 810 and the lower surface area 812 are parallel to each other and when implemented in chamber 200 lie in horizontal planes, i.e., the upper surface area 810 and lower surface area 812 of pumping liner 410 lie in planes that are horizontal, i.e., perpendicular to a gravitational vector. In one aspect, the upper lip 414 extends outwardly from the radius of the top liner 410, while the lower shoulder 416 extends radially inward. The upper lip 414 is circumferentially disposed. For this reason, the upper lip 414 is visible in both FIG. 6A and FIG. 6B. However, the lower shoulder 416 does not circumferentially encompass top liner 410, but is left open in the area of upper pumping port liner 442.

Returning to FIG. 4, the chamber 400 next comprises a circumferential liner 420. In the arrangement of FIG. 7, the liner 420 has a profile of an inverted "C". In addition, the liner 420 includes a channel portion 425. For these reasons, the liner 420 is designated as a "C-channel liner." The inverted "C" configuration is seen more clearly in the enlarged cross sectional view of FIG. 6B. With continuing reference to FIG. 6B, the C-channel liner 420 has an upper arm 421, a lower arm 423, and an intermediate inner body 422. The upper arm 421 has an upper shoulder 424 formed therein. The upper shoulder 424 is configured to receive the upper lip 414 of the pumping liner 410. At the same time, the lower arm 423 is configured to receive the lower shoulder 416 of the top liner 410. This interlocking arrangement between the top liner 410 and the C-channel liner 420 provides a circuitous interface that substantially reduces unwanted parasitic pumping. In this way, as gases are exhausted from the processing area 404 of the chamber 400 and through the pumping holes 412 of the pumping liner 410, gas is preferentially evacuated through the channel portion 425 of the C-channel liner 420.

In the process kit 40 arrangement of FIGS. 6A, 6B and 7, the upper shoulder 424 is circumferentially disposed along the upper arm 421. For this reason, the upper shoulder 424 is visible in both FIG. 6A and FIG. 6B. However, the lower lip 426 does not circumferentially encompass the C-channel liner 420, but is also left open in the area of the upper pumping port liner 442. Thus, a radial portion is left open to form a pumping port liner opening 429.

As indicated from the cutaway perspective view provided in FIG. 6, areas 6A and 6B show opposite ends of the chamber 400. The cutaway end from area 6A includes gas exhaust ports, referred to as "pumping port liners" 442, 444. An upper pumping port liner 442 is provided below the channel portion 425 of the C-channel liner 420. A lower pumping port liner 444 is then provided in fluid communication with the upper pumping port liner 442. Gas may then be exhausted out of the lower pumping port liner 444 and away from the processing chamber 400 by means of an exhaust system.

To further limit parasitic pumping at the area of the pumping port liners 442, 444, a seal member 427 is provided at the interface between the C-channel liner 420 and the upper pumping port liner 442, and at the interface between the top liner 410 and the upper pumping port liner 442. The seal member is visible at 427 in both FIG. 7 and FIG. 6B. Preferably, the seal member 427 defines a circular ring that encompasses the upper pumping port liner 442. The seal member 427 is preferably fabricated from a Teflon material or otherwise includes a highly polished surface. The seal 427 further enables the C-channel liner 420 to interlock with the pumping ports 442, 444 and to limit gas leakage.

Referring back to FIG. 7, a middle liner 440 is next disposed below the C-channel liner 420. The middle liner 440 resides in the process area 404 at the level of the slit 432. It can be seen from FIG. 7 that the middle liner 440 is a C-shaped liner, and is not circular. The open area in the middle liner 440 is configured to receive wafers as they are imported into the process chamber 400. The middle liner 440 can be partially seen in both FIG. 6A and FIG. 6B, residing below C-channel liner 420 and top liner 410.

Also visible in FIG. 7 is a bottom liner 450. In the arrangement of FIG. 7, the bottom liner 450 is disposed in the chamber 400 below the middle liner 440. The bottom liner 450 resides between middle liner 440 and bottom surface 409 of chamber 400.

Additional process kit items seen in FIG. 7 include a filler member 430 and a pressure equalization port liner 436. The filler member 430 is placed around the middle 440 and bottom 450 liners in order to fill space between the outer diameters of these liners 440, 450 and the surrounding chamber body 402. The presence of the filler member 430 aides in channeling the collection of carbon residues behind the liners 440, 450 by keeping residues from forming behind the liners 440, 450.

It is noted that the filler member 430, like the middle liner 440, is not completely circumferential. In this respect, an open portion is retained in the filler member 430 to provide fluid communication between the two process areas 404. The pressure equalization port liner 436 controls the fluid communication between the two process areas 404 by defining a sized orifice. The presence of the pressure equalization port liner 436 insures that pressures between the two process areas 404 remain the same.

It is also noted at this point that the filler member 430, the pressure equalization port liner 436, and the upper 442 and lower 444 pumping port liners are preferably coated with a highly smoothed material. An example is a polished aluminum coating. Other examples of materials provided with a very smooth surface include polymer coatings, Teflon, ceramics and quartz.

To further aide in the reduction of deposition on chamber parts, a slit valve liner 434 is provided along the slit 432. The slit valve liner 434 is likewise fabricated from a highly smoothed material such as those mentioned above.

During a deposition or etching process, the processing areas 404 is typically heated. To this end, a heater is provided with the pedestal for supporting wafers. A heater pedestal is seen at 462 in the chamber arrangement 400 of FIG. 7.

Referring again to FIG. 7, a pedestal assembly 460 is provided. The pedestal assembly 460 serves to support a substrate during processing. The pedestal assembly 460 includes not only the heater plate 462, but also a shaft 468, a pin lift 464 and a lift hoop 466 disposed there around. The pin lift 464 and lift hoop 466 aide in selectively raising the wafer above the heater plate 462. Pin holes 467 are disposed within the heater plate 462 to receive lift pins (not shown).

It is understood that the chamber 400 of FIG. 7 is illustrative, and that the improvements to the top liner in accordance with the present disclosure are viable in any deposition chamber capable of performing CVD or PECVD. Thus, other embodiments of the present disclosure may be provided. For example, the pumping liner 410 may have an inner diameter that is smaller than the inner diameter of the C-channel liner 420. This reduced dimension for the pumping liner 410 serves to reduce the inner diameter of the pumping port 405, thereby increasing velocity of gases moving out of the inner chamber 404 and through the pumping port 405. Increased gas velocity is desirable, as it reduces opportunities for carbonaceous residue buildup on chamber surfaces. It is also desirable that the liners be fabricated from a material having a highly smooth surface. This serves to reduce amorphous carbon deposition from accumulating on the surface. Examples of such material again include polished aluminum, polymer coating, Teflon, ceramics, and quartz.

It is also noted that carbon builds up on colder surfaces faster than on warmer surfaces. Because of this phenomenon, carbon tends to preferentially build up on the pumping system associated with the deposition chamber. The pumping systems are preferably heated to a temperature greater than 80° C. to reduce preferential build-up. Alternatively, or in addition, a cold trap can be integrated into the pumping system to collect unreacted carbon by-product. The cold trap can be cleaned or replaced at regular maintenance intervals.

Figure 8:
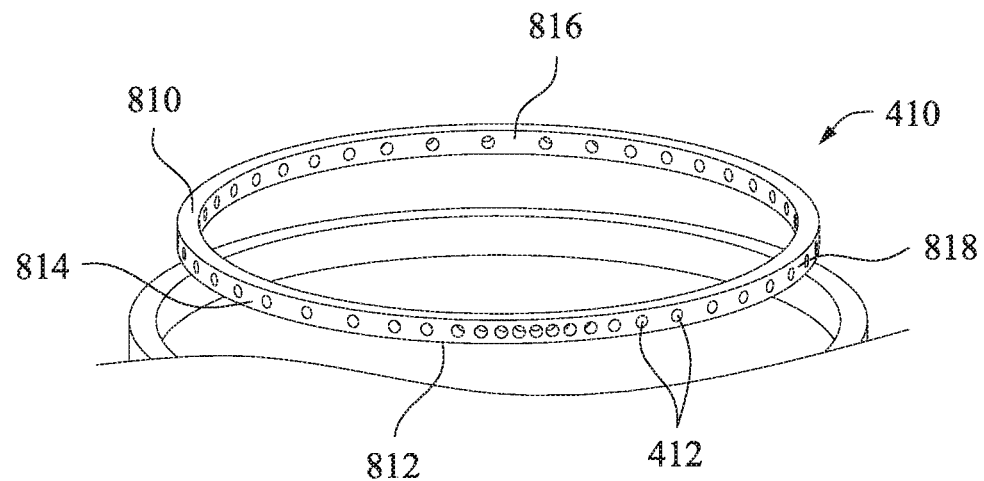
FIG. 8 is an enlarged view of a pumping liner of FIG. 7.

Referring to FIG. 8, as described above pumping liner 410 includes a plurality of apertures 412 passing through a body 814 of pumping liner 410. Body 814 includes an inner circumferential surface 816 extending between upper surface area 810 and lower surface area 812. Body also includes an outer circumferential surface 818 extending between upper surface area 810 and lower surface area 812. Apertures 412 pass through body 814 between inner circumferential surface 816 and outer circumferential surface 818. As described below in more detail with reference to FIGS. 9 and 10, in accordance with some embodiments of the present disclosure, spacing between apertures 412 that are adjacent (i.e., next to) to each other is unequal or uneven. Spacing between adjacent apertures as used in the present disclosure refers to a distance between a centerline of a pair of two adjacent apertures as measured along the inner circumferential surface 816 or outer circumferential surface 818 of pumping liner 410. Unequal or uneven spacing refers to a situation when a distance between a centerline of a first pair of two adjacent apertures as measured along the inner circumferential surface 816 or outer circumferential surface 818 of pumping liner 410 is different than a distance between the centerline of a second pair of two adjacent apertures as measured along the inner circumferential surface 816 or outer circumferential surface 818 of pumping liner 410. Alternatively, in accordance with embodiments of the present disclosure, unequal or uneven spacing between a centerline of two adjacent apertures means a pitch between a centerline of a first pair of two adjacent apertures and a pitch between the centerline of a second pair of two adjacent apertures is different.

Figure 9:
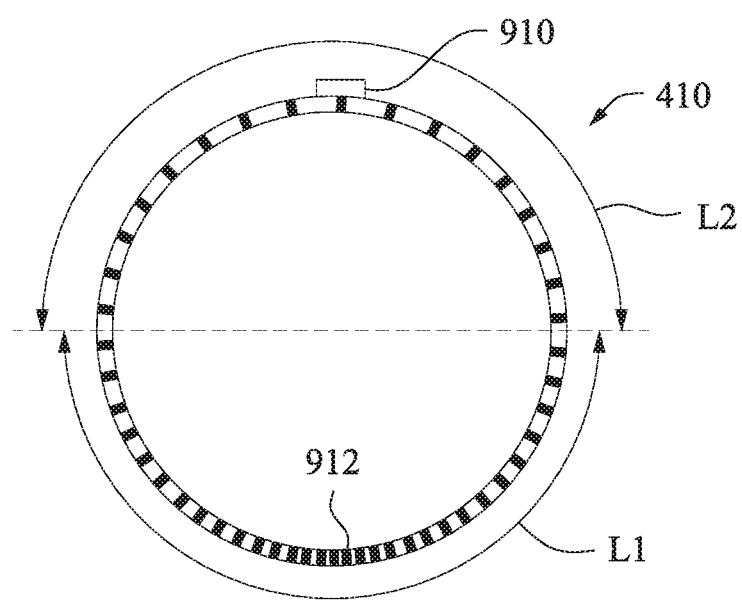
FIG. 9 is a top view of a pumping liner formed in accordance with some embodiments of the present disclosure.
Figure 10:
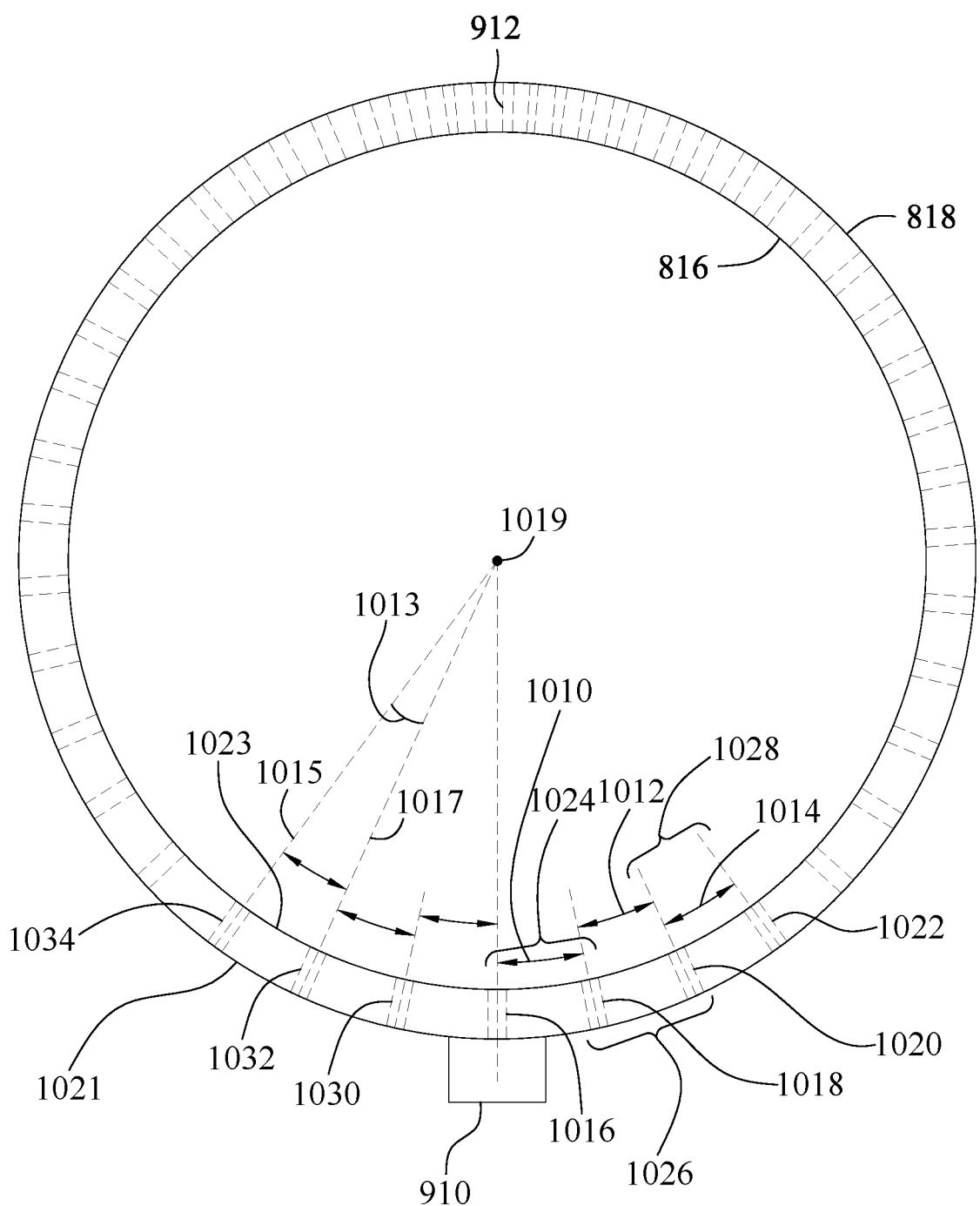
FIG. 10 is a top schematic view of a pumping liner in accordance with some embodiments of the present disclosure.

Referring to FIG. 9, an exhaust port 910 is schematically illustrated near the top of the illustrated pumping liner 410. Exhaust port 910 serves as a conduit through which process gas which has passed from the processing chamber 200 through apertures 412 of pumping liner 410 and into channel portion 425 can be exhausted from channel portion 425. Referring to FIG. 10, aperture 1016 is illustrated as being the closet aperture to exhaust port 910. In the embodiment of FIG. 10, aperture 1016 is closer to exhaust port 910 than apertures 1018, 1020 and 1022. Similarly, aperture 1016 is closer to exhaust port 910 than apertures 1030, 1032 and 1034.

Referring to FIG. 10, a pitch between adjacent apertures refers to the central angle 1013 (angle formed by two radii 1015 and 1017 with the vertex being at the center 1019 of the circular pumping liner 410) formed by the centerlines of adjacent apertures 1032 and 1034 and the center of the circular pumping liner 410. A pitch between adjacent apertures 1016 and 1018 is identified by reference numeral 1010. A pitch between adjacent apertures 1018 and 1020 is identified by reference numeral 1012. A pitch between adjacent apertures 1020 and 1022 is identified by reference numeral 1014. Changes in the central angle 1013 result in proportional changes in the intercepted minor arcs 1021 and 1023 defined by the arc between the centerlines of adjacent apertures 1032 and 1034 as measured on the respective outer circumferential surface 818 and inner circumferential surface 816.

Referring to FIGS. 9 and 10, the following description of the unequal or uneven spacing between adjacent apertures in accordance with embodiments described herein is provided with reference to the unequal pitch between adjacent apertures; however, the description applies equally to the distance between adjacent apertures as measured along the inner circumferential surface 816 or the outer circumferential surface 818 of pumping liner 410. In accordance with embodiments of FIG. 10, a pitch 1010 between first aperture 1016 and second aperture 1018 (which are adjacent to each other) defining first aperture pair 1024 is unequal to a pitch 1012 between second aperture 1018 and third aperture 1020 (which are adjacent to each other) defining second aperture pair 1026, which is adjacent to (directly next to) the first aperture pair 1024. In accordance with embodiments of the present disclosure, the pitch 1012 between second aperture 1018 and third aperture 1020 defining second aperture pair 1026 is unequal to the pitch 1014 between third aperture 1020 and fourth aperture 1022 defining third aperture pair 1028. In accordance with some embodiments of the present disclosure, an amount by which pitch 1010 differs from pitch 1012 and an amount pitch 1012 differs from pitch 1014 are equal. In other words, in accordance with embodiments of the present disclosure where pitch 1014 is less than pitch 1012 which is less than pitch 1010, the amount by which pitch 1012 is less than pitch 1010 is equal to the amount pitch 1014 is less than pitch 1012. Stated differently, in accordance with some embodiments of the present disclosure, the spacing between adjacent apertures 412 of pumping linear 410 decreases at regular intervals as the apertures become further removed from exhaust port to the point where an aperture that is furthest from exhaust port 910 is reached, (e.g., aperture 912 in FIGS. 9 and 10). At such point the spacing between adjacent apertures 412 of pumping linear 410 increase at regular intervals as the apertures become closer to exhaust port 910. In accordance with other embodiments of the present disclosure, spacing between adjacent apertures 412 of pumping linear 410 can increase at regular intervals as the apertures become further removed from exhaust port 910 to the point where an aperture that is furthest from exhaust port 910 is reached (e.g., aperture 912 in FIG. 9). In accordance with such alternative embodiments, at such point the spacing between adjacent apertures 412 of pumping linear 410 decreases at regular intervals as the apertures become closer to exhaust port 910. Examples of regular intervals by which the spacing between adjacent apertures increases or decreases include 0.05°, 0.1°, 0.2°, 0.3°, 0.4°, 0.5° or more, with 0.4° providing desired process gas velocity and process gas pressure profiles within the processing chamber. The relative inequality of spacing between adjacent apertures of a pumping liner is in accordance with embodiments of the present invention is chosen to affect the velocity profile of process gases within the processing chamber and the pressure profile of the process gases within the processing chamber to be more uniform across the work piece surface in the processing chamber compared to when spacing of apertures around the circumference of the pumping liner are equal. Embodiments of the present disclosure are not limited to a pumping liner where spacing between adjacent apertures increases or decreases at intervals. The regular intervals by which the spacing between adjacent apertures increases or decreases can differ from the described specific angular regular intervals. Described mathematically, the pitch between adjacent apertures of a first aperture pair is X degrees (°) and a pitch between adjacent apertures of a second aperture pair that is adjacent to the first aperture pair (e.g., first aperture pair 1024 and second aperture pair 1026 or second aperture pair 1026 and third aperture pair 1028) is X−0.05° to 0.5°. In other embodiments, the pitch between adjacent apertures of a first aperture pair is X degrees)(° and a pitch between adjacent apertures of a second aperture pair that is adjacent to the first aperture pair (e.g., first aperture pair 1024 and second aperture pair 1026 or second aperture pair 1026 and third aperture pair 1028) is X−0.1° to 0.4°. When the spacing between adjacent apertures of a first aperture pair is X degrees (°), a pitch between the adjacent apertures of a second aperture pair different from the first aperture pair satisfies the equation X°−my, wherein m is an integer and y is between 0.1° and 0.4°. In alternative embodiments in accordance with the present disclosure, the minus sign in the foregoing equations is replaced with a plus sign.

Referring to FIG. 9, unequal spacing of apertures in accordance with embodiments of the present disclosure results in a pumping linear 410 that includes a portion L1 and a portion L2 that include a different number of apertures 412. For example in FIG. 9, portion L2 of pumping linear 410 includes 17 apertures and portion L1 includes 31 apertures. Embodiments of the present disclosure are not limited to the size of L1 or L2 illustrated in FIG. 9, the number of specific apertures in portions L1 and L2 or the location of L1 and L2. Portions L1 and L2 can be different lengths, provided they are equal in length, and the number of apertures in portion L1 can be less than or greater than 31 and the number of apertures in portion L2 can be less than or greater than 17, provided the number of apertures associated with L1 and the number of apertures associated with L2 are not equal.

While embodiments in accordance with the present disclosure have been described with reference to the spacing between adjacent apertures increasing or decreasing at regular intervals, the present disclosure is not limited to pumping ring that include apertures where the spacing between adjacent apertures increases or decreases at regular intervals. For example, embodiments in accordance with the present disclosure include apertures where the spacing between adjacent apertures does not increase a regular intervals as the apertures move further away from pumping port 910. In other words, in accordance with embodiments of the present disclosure the spacing between adjacent apertures increases or decreases in unequal or uneven amounts.

The number of apertures included in pumping liners in accordance with embodiments described herein varies. Although the specific embodiments described herein and the drawings illustrate pumping linear that include 48 apertures, other embodiments of pumping liners in accordance with the present disclosure include a greater or lesser number of apertures, e.g., 35 to 65 apertures. Pumping liners including 40 and 60 apertures are included in the present disclosure. Pumping liners including 48 apertures with unequal spacing, e.g., 0.4°, as described herein, provide more uniform process gas velocity profiles and process gas pressure profiles within processing chambers utilizing such pumping liners compared to processing chambers employing pumping liners with fewer or more apertures that are equally spaced apart.

Figure 12:
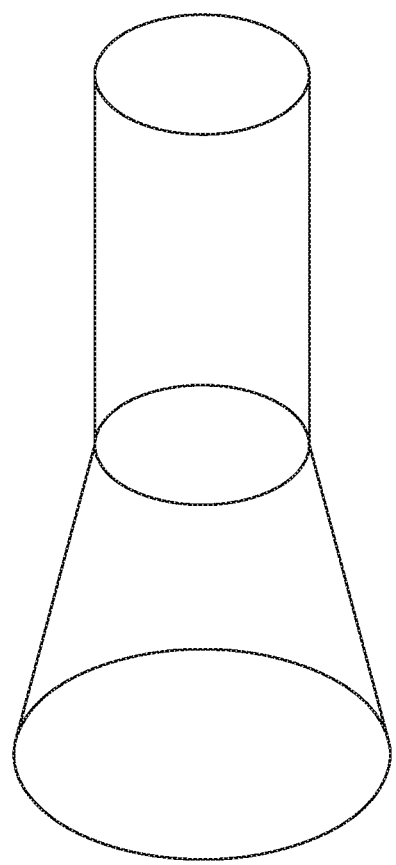
FIG. 12 a schematic view of one embodiment of an aperture of a pumping liner in accordance with some embodiments of the present disclosure.
Figure 1:
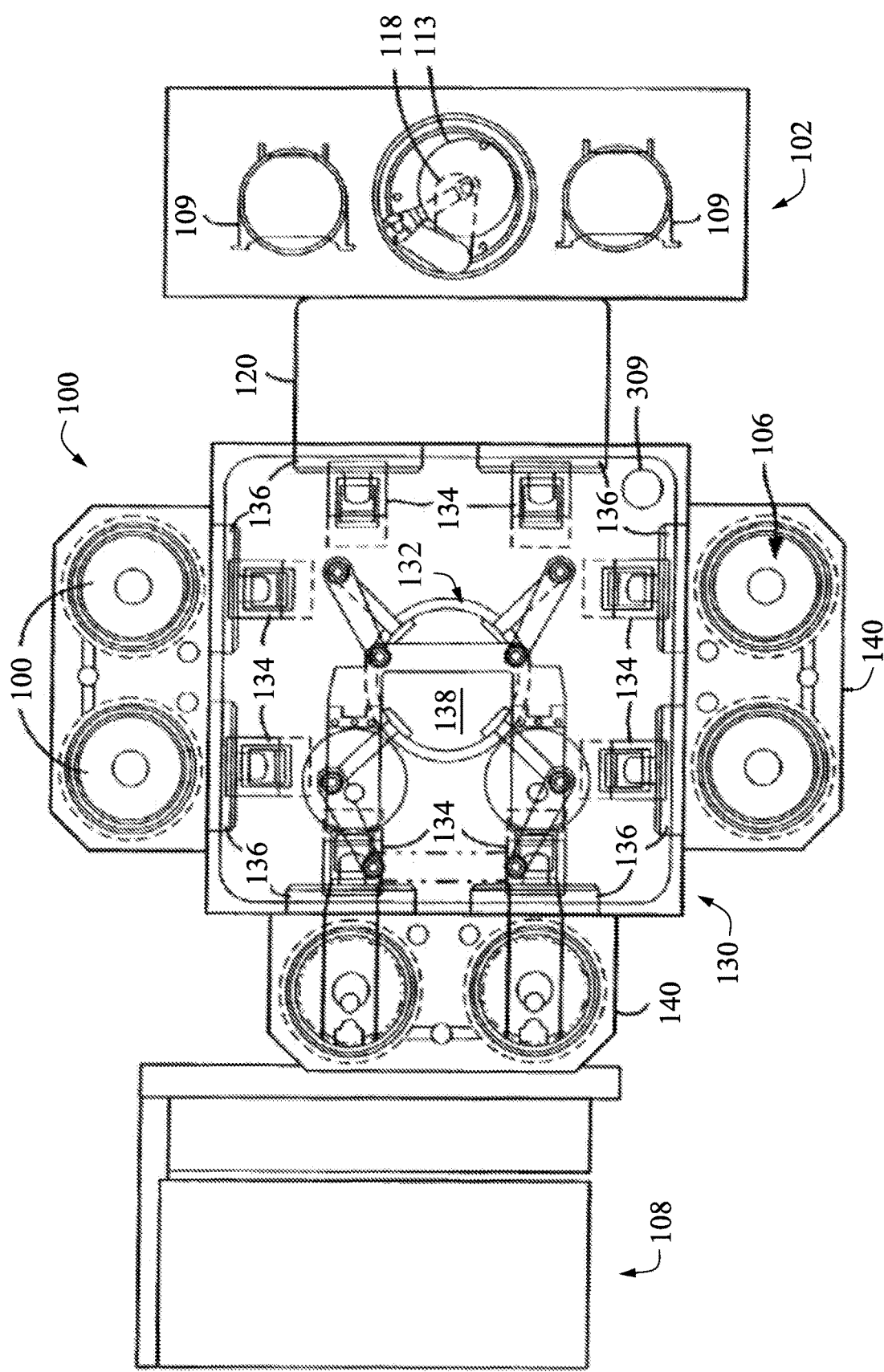

In accordance with embodiments of the present disclosure, apertures 412 are cylindrical and have a circular cross-section or are not cylindrical and have a noncircular cross-section (see FIGS. 10 and 12). For example, apertures 412 can have a polygonal cross-section, such as a triangular, rectangular, pentagonal, hexagonal, etc., cross-section. An aperture 412 can include a combination of different cross-sectional sizes and shapes as illustrated in FIG. 12. In FIG. 12, an example aperture includes a cylindrical portion with a circular cross-section and a portion with a frusto-conical shape. The diameter or cross-sectional area of apertures 412 can vary. For example, when apertures 412 have a circular cross-section, in some embodiments their diameter falls within the range of 1 mm to 7 mm, in other embodiments, the diameter of apertures 412 falls within the range of 4 mm to 7 mm, in other embodiments the diameter of apertures falls within a range of 2 mm to 6 mm. In embodiments where the cross-section of apertures 412 are not circular, the cross-sectional area of apertures 412 is equal to or similar to the cross-sectional area provided by an aperture having a circular cross-section and the diameters described above.

Figure 11:
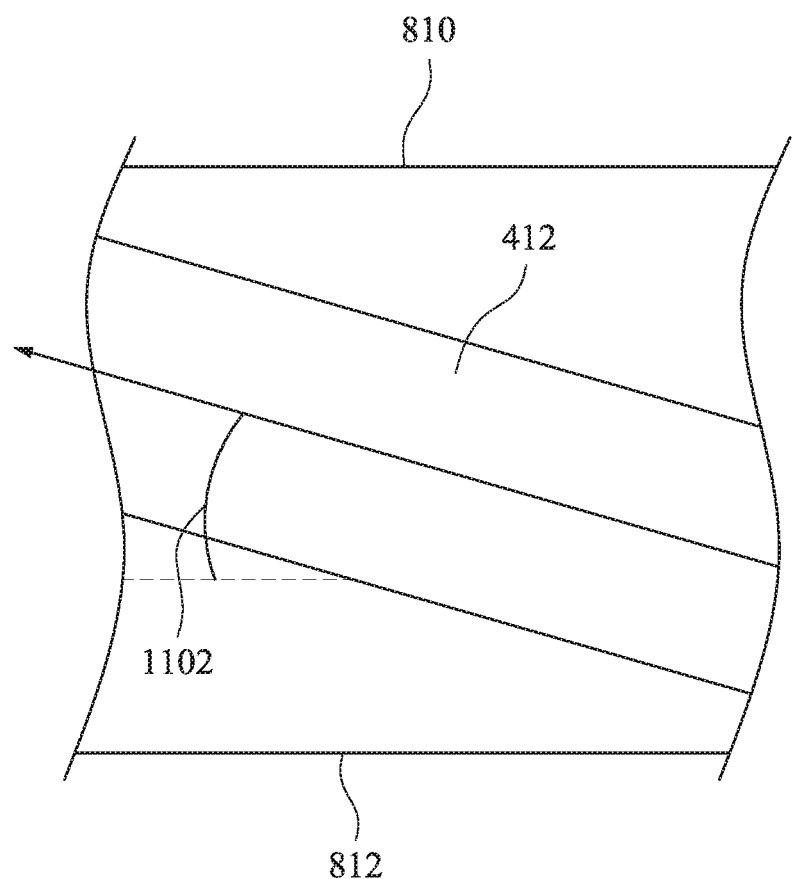
FIG. 11 is a schematic view of a vertical cross-section through an aperture of a pumping liner in accordance with some embodiments of the present disclosure.
Figure 12:
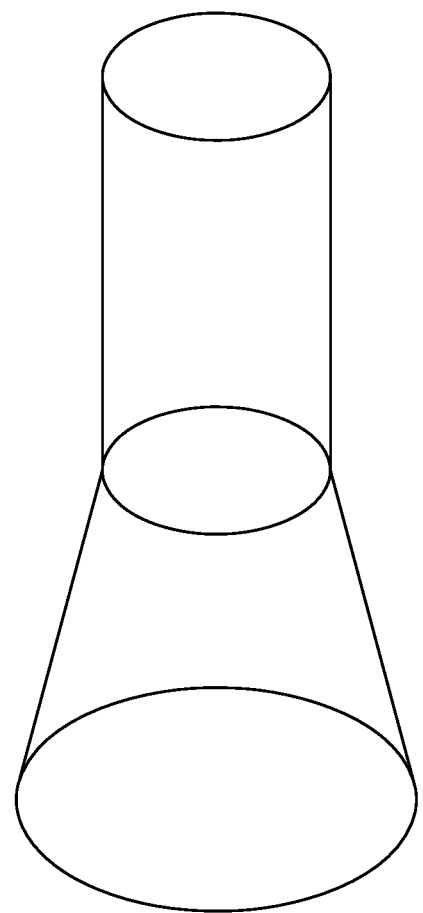

Referring to FIGS. 8 and 11, in some embodiments, apertures 412 are tilted relative to upper surface 810 and lower surface 812. In accordance with embodiments illustrated in FIG. 11, aperture 412 is tilted at an angle 1102 relative to the horizontal upper surface area 810 and horizontal lower surface 812. In accordance with these embodiments of the present disclosure, the angle by which aperture 412 is tilted varies. For example, aperture 412 can be tilted by an angle 1102 that ranges between 0° to 60°. In accordance with other embodiments, aperture 412 can be tilted at an angle that is greater than 60°.

Figure 13:
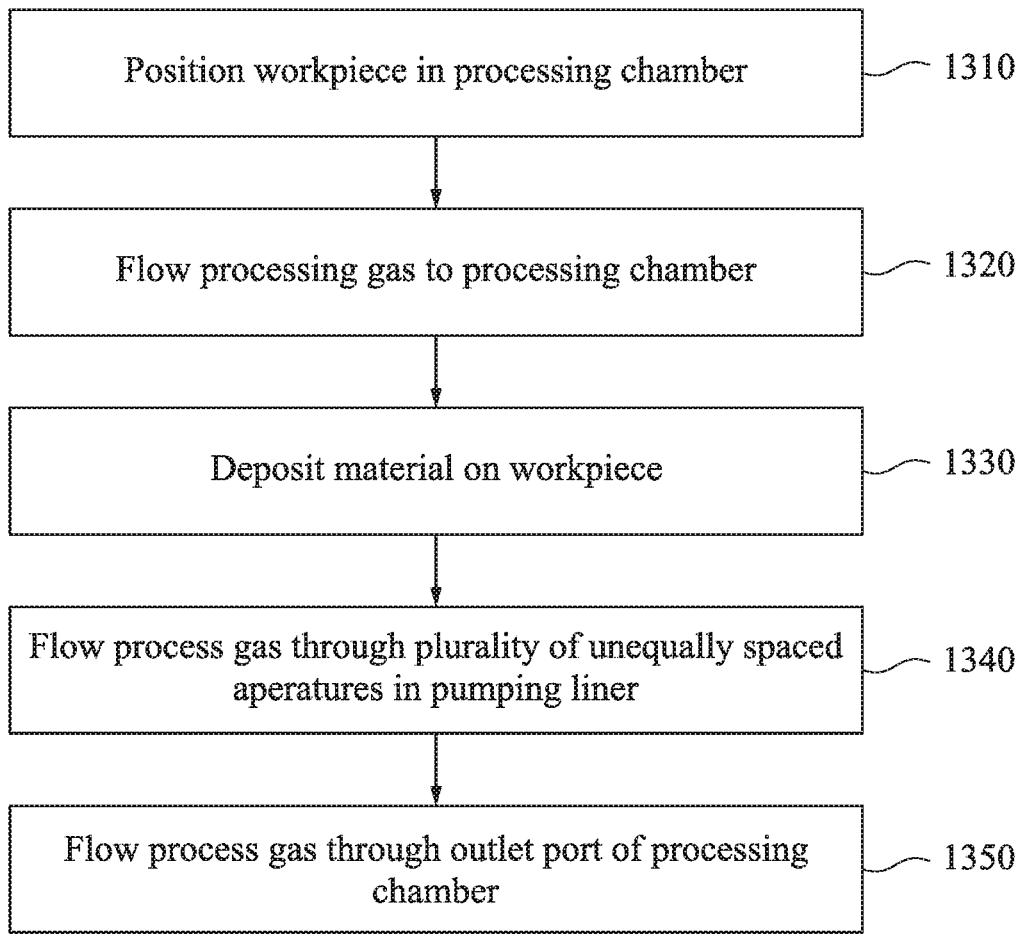
FIG. 13 is a flow chart of steps of a method of depositing a material on a work piece utilizing a processing chamber that includes a pumping liner in accordance with some embodiments of the present disclosure.

FIG. 13 is a flow chart illustrating steps of a method for depositing a material on a work piece by chemical vapor deposition utilizing a pumping liner in accordance with embodiments described herein. The example method includes positioning a work piece in a processing chamber at step 1310. At step 1320 a processing gas is flowed to the processing chamber. The processing chamber is operated under conditions that promote the chemical vapor deposition of material from the processing gas on the work piece at step 1330. Processing gas flows through a plurality of unequally spaced apertures extending through a pumping liner of the processing chamber at step 1340. At step 1350, processing gas that has flowed through the apertures is collected and flows through an exhaust port of the processing chamber.

The present inventors have observed that carrying out chemical vapor deposition processes utilizing a pumping liner with unevenly spaced apertures, in accordance with embodiments described herein, produces layers or films of material deposited on a work piece that exhibit an improved uniformity with respect to properties, such as thickness, surface flatness and surface smoothness. The present inventors have also observed that carrying out chemical vapor deposition processes utilizing a pumping liner in accordance with embodiments described herein reduces waste of processing gases resulting from uneven pumping conditions, e.g., gas velocity and gas pressures, of the processing gases within the processing chamber.

Embodiments in accordance with the present disclosure include apparatuses for depositing a material on a workpiece using a chemical vapor deposition process. Described apparatuses include a processing chamber. The processing chamber is provided with a pumping liner. The pumping liner includes a plurality of apertures through which gas within the processing chamber is exhausted from the processing chamber. The pumping liner includes a body, an inner circumferential surface and an outer circumferential surface. A plurality of apertures comprising a plurality of aperture pairs pass through the body of the pumping liner. Each aperture pair includes adjacent apertures. The adjacent apertures of each aperture pair are spaced apart a distance, measured along the inner circumferential surface. The distance between adjacent apertures of the plurality of aperture pairs is unequal.

In accordance with other embodiments of the present disclosure, a pumping liner is described for use in a method of depositing a material on a workpiece by chemical vapor deposition. The pumping liner includes a body, an inner circumferential surface and an outer circumferential surface. A first aperture, a second aperture and a third aperture extends through the body from the inner circumferential surface to the outer circumferential surface. A second aperture is intermediate the first aperture and the third aperture. The first aperture and the second aperture form a first aperture pair with a first distance measured along the outer circumferential surface separating the first aperture and the second aperture of the first aperture pair. The second aperture and third aperture define a second aperture pair, wherein the distance separating the second aperture and the third aperture of the second aperture pair, measured along the outer circumferential surface, is unequal to the first distance.

In accordance with other embodiments of the present disclosure, methods of depositing a material on a workpiece by chemical vapor deposition are described. Described embodiments include steps of positioning a workpiece within a processing chamber and flowing a processing gas to the processing chamber. The process gas within the processing gas is flowed through a plurality of apertures extending through a pumping liner to remove the gas from the pumping chamber. The spacing between the adjacent apertures of the pumping liner is unequal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An apparatus for depositing a material on a work piece by chemical vapor deposition, the apparatus comprising:
   a processing chamber, the processing chamber including a pedestal assembly, which in operation, supports a work piece; and
   a pumping liner defining a circumferential body having a plurality of apertures including a first aperture, a second aperture and a third aperture, disposed around the circumferential body, through which gas within the processing chamber is exhausted from the processing chamber, each of the plurality of apertures consisting a first portion having a cylindrical shape and a circular cross section of a same diameter and a second portion having a frustoconical shape and a circular cross-section, the frustoconical shape of the second portion including a smaller diameter first end and a larger diameter second end, the first portion extending from the smaller diameter first end of the frustoconical shape of the second portion, the circumferential body including an inner circumferential surface, an outer circumferential surface, an upper surface and a lower surface, wherein each of the plurality of apertures are tilted relative to the upper surface, are tilted relative to the lower surface and extend through the body from the inner circumferential surface to the outer circumferential surface, the second aperture being intermediate the first aperture and the third aperture and directly adjacent to the first aperture and the third aperture, the first aperture and the second aperture defining a first aperture pair, a first distance between a centerline of the first aperture and a centerline of the second aperture of the first aperture pair measured along the outer circumferential surface separating the first aperture and the second aperture of the first aperture pair, the second aperture and the third aperture defining a second aperture pair, a second distance between a centerline of the second aperture and a centerline of the third aperture of the second aperture pair measured along the outer circumferential surface separating the second aperture and the third aperture of the second aperture pair; and
   an exhaust port through which the gas which has passed through the first aperture, the second aperture and the third aperture of the pumping liner is exhausted from the processing chamber, wherein the first aperture pair is closer to the exhaust port than the second aperture pair and the first distance for the first aperture pair is less than the second distance for the second aperture pair.

2. The apparatus of claim 1, wherein the pumping liner includes two circumferential portions of equal length L measured along the outer circumferential surface, one portion including a greater number of apertures compared to the other portion.

3. The apparatus of claim 1, wherein a pitch between the first aperture and the second aperture of the first aperture pair is X degrees (°) and a pitch between the second aperture and the third aperture of the second aperture pair, directly adjacent to the first aperture pair, is X° plus 0.05° to 0.5°.

4. The apparatus of claim 3, wherein an amount a pitch between directly adjacent apertures of a third aperture pair, directly adjacent to the second aperture pair, differs from the difference in the pitch between the apertures of the first aperture pair and the pitch between the apertures of the second aperture pair, is unequal to a difference between the pitch of the apertures of the first aperture pair and the pitch of the apertures of the second aperture pair.

5. The apparatus of claim 1, wherein the first aperture, the second aperture and the third aperture are among a plurality of 35 to 65 apertures.

6. The apparatus of claim 1, wherein the same diameter of the apertures is between 4 to 7 mm.

7. A pumping liner for use in a method of depositing a material on a work piece by chemical vapor deposition, the pumping liner comprising:
  a circumferential body having a plurality of apertures disposed entirely around the circumferential body;
  an inner circumferential surface;
  an outer circumferential surface;
  an upper surface;
  a lower surface;
  the plurality of apertures including a first aperture, a second aperture and a third aperture, the first aperture directly adjacent the second aperture and the third aperture directly adjacent the second aperture, each of the first aperture, the second aperture and the third aperture consists of a first portion having a cylindrical shape and a circular cross section and a second portion having a frustoconical shape and a circular cross-ssection, the frustoconical shape of the second portion including a smaller diameter first end and a larger diameter second end, the first portion extending from the smaller diameter first end of the frustoconical shape of the second portion, each of the first aperture, the second aperture and the third aperture tilted relative to the upper surface, each of the first aperture, the second aperture and the third aperture tilted relative to the lower surface and each of the first aperture, the second aperture and the third aperture extending through the body from the inner circumferential surface to the outer circumferential surface, the second aperture being intermediate the first aperture and the third aperture and directly adjacent to the first aperture and the third aperture, the first aperture and the second aperture defining a first aperture pair, a first distance between a centerline of the first aperture and a centerline of the second aperture of the first aperture pair measured along the outer circumferential surface separating the first aperture and the second aperture of the first aperture pair, the second aperture and the third aperture comprising a second aperture pair, a second distance between a centerline of the second aperture and a centerline of the third aperture of the second aperture pair measured along the outer circumferential surface separating the second aperture and the third aperture of the second aperture pair; and
  an exhaust port through which gas which has passed through the first aperture, the second aperture and the third aperture of the pumping liner is exhausted, wherein the first aperture pair is closer to the exhaust port than the second aperture pair and the first distance for the first aperture pair is less than the second distance for the second aperture pair.

8. The pumping liner of claim 7, wherein the pumping liner includes two circumferential portions of equal length L measured along the outer circumferential surface, one portion including a greater number of apertures compared to the other portion.

9. The pumping liner of claim 7, further comprising a fourth aperture, the third aperture being intermediate the second aperture and the fourth aperture and directly adjacent to the second aperture and the fourth aperture, the third aperture and the fourth aperture comprising a third aperture pair, a third distance between a centerline of the third aperture and a centerline of the fourth aperture of the third aperture pair measured along the outer circumferential surface separating the third aperture and the fourth aperture of the third aperture pair, wherein the difference between the first distance and the second distance is equal to the difference between the second distance and the third distance.

10. The pumping liner of claim 7, wherein the distance between directly adjacent apertures of two directly adjacent aperture pairs varies at a regular interval.

11. The pumping liner of claim 7 wherein a pitch between the first aperture and the second aperture of the first aperture pair is X degrees (°) and a pitch between the second aperture and the third aperture of the second aperture pair, directly adjacent to the first aperture pair, is X° plus 0.1° to 0.4°.

12. The pumping liner of claim 11, wherein an amount a pitch between directly adjacent apertures of a third aperture pair, directly adjacent to the second aperture pair, differs from the difference in the pitch between the apertures of the first aperture pair and the pitch between the apertures of the second aperture pair, is unequal to a difference between the pitch of the apertures of the first aperture pair and the pitch of the apertures of the second aperture pair.

13. The pumping liner of claim 7, wherein a pitch between the first aperture and the second aperture of the first aperture pair is X degrees (°) and a pitch between the second aperture and the third aperture of the second aperture pair satisfies the equation X°+my, wherein m is an integer and y is between 0.1° and 0.4°.

14. The pumping liner of claim 7, wherein the first aperture, the second aperture and the third aperture are among a plurality of 35 to 65 apertures.

15. The pumping liner of claim 7, wherein the first portion of the first aperture, second aperture and third aperture have a same diameter.

16. A system for depositing a material on a work piece by chemical vapor deposition, the system comprising:
  a processing chamber, the processing chamber including
    a pedestal assembly, which in operation, supports a work piece;
  a pumping liner within the processing chamber and defining a circumferential body having a plurality of apertures disposed entirely around the circumferential body, the pumping liner further including:
    an upper surface;
    a lower surface;
    an inner circumferential surface;

an outer circumferential surface, wherein the plurality of apertures including a first aperture directly adjacent a second aperture and a third aperture directly adjacent the second aperture, each of the first aperture, the second aperture and the third aperture consisting a first portion having a cylindrical shape and a circular cross section and a second portion having a frustoconical shape and a circular cross section, the frustoconical shape of the second portion including a smaller diameter first end and a larger diameter second end, the first portion extending from the smaller diameter first end of the frustoconical shape of the second portion, each of the first aperture, the second aperture and the third aperture extending through the body from the inner circumferential surface to the outer circumferential surface, the second aperture being intermediate the first aperture and the third aperture, the first aperture and the second aperture defining a first aperture pair, a first distance between a centerline of the first aperture and a centerline of the second aperture of the first aperture pair measured along the outer circumferential surface separating the first aperture and the second aperture of the first aperture pair, the second aperture and the third aperture comprising a second aperture pair, a second distance between a centerline of the second aperture and a centerline of the third aperture of the second aperture pair measured along the outer circumferential surface separating the second aperture and the third aperture of the second aperture pair; and an exhaust port through which gas which has passed through the first aperture, the second aperture and the third aperture of the pumping liner is exhausted from the processing chamber, wherein the first aperture pair is closer to the exhaust port than the second aperture pair and the first distance for the first aperture pair is less than the second distance for the second aperture pair.

17. The system of claim 16, wherein the apertures are tilted.

18. The system of claim 17, wherein the apertures are tilted relative to the upper surface.

19. The system of claim 16, wherein the first aperture, the second aperture and the third aperture are tilted relative to the upper surface and the first aperture, the second aperture and the third aperture are tilted relative to the lower surface.

20. The system of claim 16, wherein the first aperture, the second aperture and the third aperture are among a plurality of 35 to 65 apertures.

* * * * *